United States Patent [19]
Koitabashi et al.

[11] Patent Number: 5,640,243
[45] Date of Patent: Jun. 17, 1997

[54] POSITION DETECTION METHOD

[75] Inventors: Hideki Koitabashi, Tokyo; Masamitsu Yanagihara; Junji Hazama, both of Yokohama, all of Japan

[73] Assignee: Nikon Corporation, Tokyo, Japan

[21] Appl. No.: 429,192

[22] Filed: Apr. 26, 1995

[30]     Foreign Application Priority Data

Apr. 27, 1994  [JP]  Japan ................... 6-111999

[51] Int. Cl.$^6$ .......................................... G01B 11/00
[52] U.S. Cl. ................................. 356/401; 250/548
[58] Field of Search ........................... 356/399–401; 355/43, 53, 77; 250/548, 559.3

[56]              References Cited

U.S. PATENT DOCUMENTS 5,189,494  2/1993  Muraki ............................ 356/401
5,309,197  5/1994  Mori ............................... 355/53

*Primary Examiner*—Frank Gonzalez
*Assistant Examiner*—Michael P. Stafira
*Attorney, Agent, or Firm*—Shapiro and Shapiro

[57]                ABSTRACT

An image in which a feature corresponding to a reference mark formed at a predetermined position in an exposure apparatus is formed at a predetermined position in an arbitrary area is stored as a reference image, and a reference image including an image corresponding to the reference mark is detected from an image to be processed obtained by picking up an image near the reference mark to detect the position of the reference mark in the image to be processed, thus enabling detection of the positional relationship between a reference in the exposure apparatus and substrate alignment means.

6 Claims, 5 Drawing Sheets

(x,y): COORDINATE SYSTEM IN PATTERN MATCHING DEVICE
(X,Y): COORDINATE SYSTEM OF STAGE

POSITION DETECTION METHOD

BACKGROUND OF THE INVENTION

1. Field of the Invention

The present invention relates to a position detection method and, more particularly, to a method which is suitably used for an exposure apparatus for protecting and transferring a pattern on a reticle onto a photosensitive substrate in the manufacture of semiconductor integrated circuits, liquid crystal display elements, and the like.

2. Related Background Art

In an exposure apparatus of this type, a so-called baseline measurement for measuring the relative positional relationship between a reticle alignment device for aligning, e.g., a reticle, and a substrate alignment device for aligning a photosensitive substrate using an absolute coordinate system in the exposure apparatus, is performed prior to exposure. In general, the baseline measurement is achieved in such a manner that a reference mark formed on a stage is detected by a reticle alignment microscope of the reticle alignment device to measure the detection center position of the reticle alignment device on a stage coordinate system, and the reference mark on the stage is detected by a substrate alignment microscope of the substrate alignment device to measure the detection center position of the substrate alignment device on the stage coordinate system. In this case, the moving coordinate system of the stage on which the reference mark is formed serves as an absolute coordinate system in the exposure apparatus.

As the reticle alignment device and the substrate alignment device, devices which use pattern matching image processing are known. In order to use a new alignment device adopting the pattern matching processing in the exposure apparatus, baseline measurement must be performed to obtain the relationship between the detection center position of the alignment device and the absolute coordinate system (stage coordinate system) in the exposure apparatus.

In a position detection method based on pattern matching, an image S to be processed including a mark M, as shown in FIG. 4, is searched to find a position matching a template image T formed with the same mark TM as the mark M, as shown in FIG. 5. In this example, as a pattern matching processing result, a position R1 in the image to be processed, which corresponds to an origin O1 of the template image T, is obtained.

Note that a measurement result required upon execution of the baseline measurement is the value of a center iR of the mark M shown in FIG. 4, which corresponds to a center TS1 of the mark M1 in FIG. 5. In other words, the measurement result required upon execution of the baseline measurement is the position, in the image S to be processed, of the center iR of the mark M. However, since the template image T is an image fetched from an actual image into a pattern matching device by appropriately changing its size so as to include the mark TM, there is no method of detecting the position of the mark TM in the frame of the template image T. Therefore, the position of a point R1 in the image S to be processed can be detected, but the position, in the image S to be processed, of the center iR of the mark M cannot be detected.

Therefore, the relative positional relationship between the reticle alignment device and the substrate alignment device, i.e., the so-called baseline, cannot be accurately measured.

SUMMARY OF THE INVENTION

The present invention has been made in consideration of the above situation, and an object of the invention is to provide a method which can detect an accurate position by simple pattern matching image processing.

In order to achieve the above object, the position detection method of the present invention includes: the step of forming a first mark at a predetermined position in an image with a predetermined size, and memorizing the image as a reference image; the step of picking up an image of a portion near a reference mark formed at a predetermined position in a predetermined reference coordinate system to obtain an image to be processed formed with an image of the reference mark; the step of performing pattern matching for the image to be processed using the reference image to detect a position of the reference mark in the image to be processed; and the step of obtaining the relationship between the image to be processed and the reference coordinate system on the basis of the position of the reference mark image in the image to be processed.

According to the above-mentioned method, the first mark having substantially the same shape as that of the reference mark formed at the predetermined position in the reference coordinate system of an exposure apparatus is formed at the predetermined position of an image with a predetermined size, and the image is memorized (or registered) as a reference image. Pattern matching between an image to be processed obtained by picking up an image near the reference mark and the reference image is performed to detect the position of the reference mark image in the image to be processed. In this case, since the position of the first mark in the reference image is accurately determined, the position of the reference mark image in the image to be processed can be accurately detected, and the relationship between the reference coordinate system and the image to be processed can also be accurately detected.

DESCRIPTION OF THE PREFERRED EMBODIMENTS

An embodiment of the present invention will be described in detail hereinafter with reference to the accompanying drawings.

Figure 1:
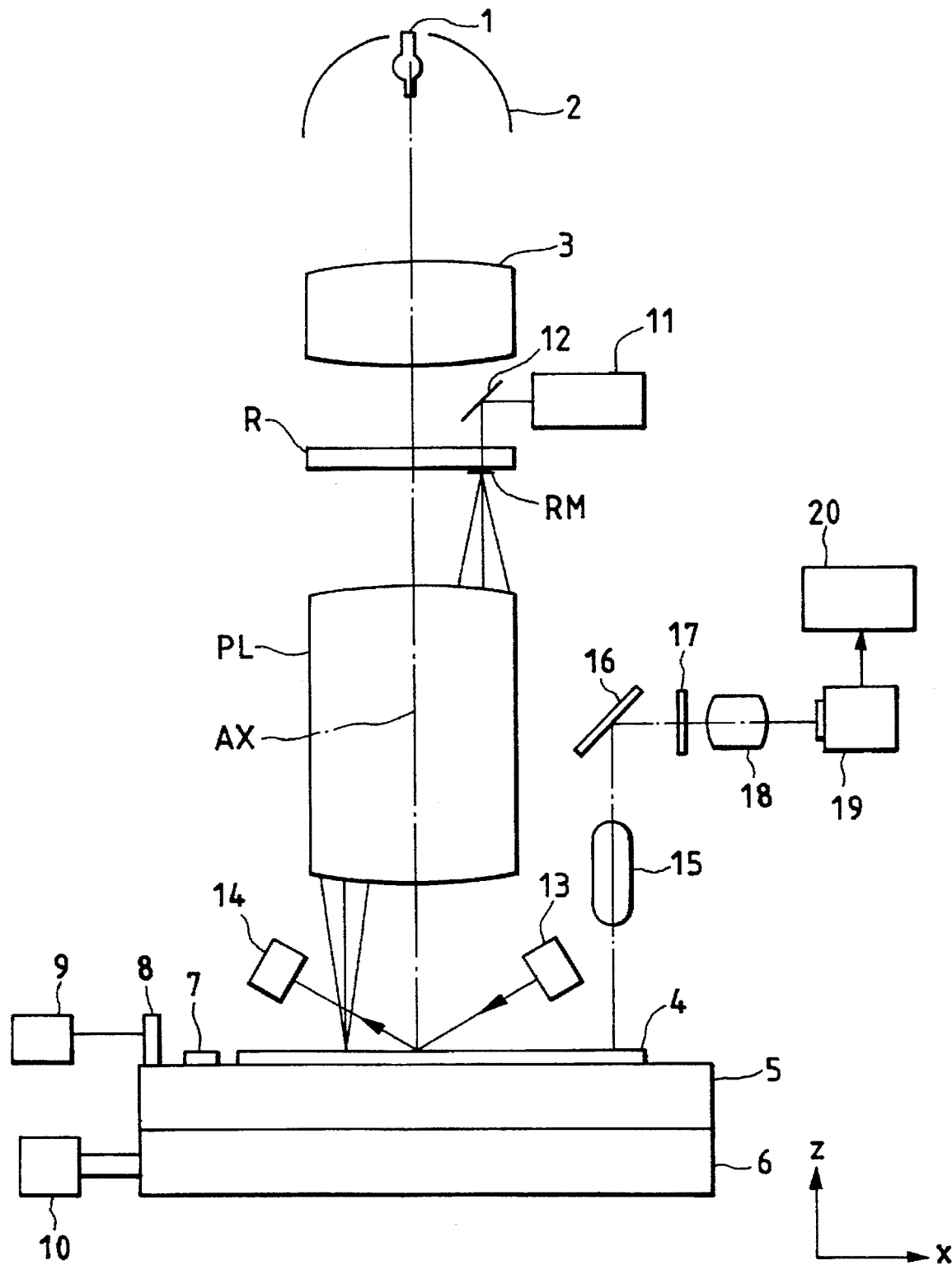
FIG. 1 is a view showing the arrangement of a projection exposure apparatus in which a position detection method according to the present invention is used.

FIG. 1 shows the schematic arrangement of a projection exposure apparatus which performs alignment using image processing based on a pattern matching method and is used in the manufacture of large-scale liquid crystal display elements. Referring to FIG. 1, exposure light emitted by a light source 1 such as a mercury lamp is condensed by an elliptic mirror 2, and is then incident on a condenser lens system 3 via an optical integrator (not shown), and the like. The exposure light condensed by the condenser lens system 3 illuminates a reticle R with an almost uniform illuminance. A pattern on the reticle R is exposed and projected onto each shot area on a glass plate 4 coated with a photosensitive material as a photosensitive substrate via a projection optical system PL. When a plurality of layers of circuit patterns are formed on the glass plate 4 to overlap each other, a large-scale liquid crystal display element substrate is manufactured.

The glass plate 4 is held on a Z stage 5, and the Z stage 5 is placed on an X-Y stage 6. The X-Y stage 6 aligns the glass plate 4 in a plane (X-Y plane) perpendicular to the optical axis of the projection optical system PL, and the Z stage 5 aligns the glass plate 4 in the direction of the optical axis (Z-axis) of the projection optical system PL. Note that a θ table (not shown) for rotating the glass plate 4 is inserted between the Z stage 5 and the glass plate 4.

A reference mark plate 7 formed with various alignment marks is fixed in the vicinity of the glass plate 4 on the Z stage 5. Furthermore, a movable mirror 8 for the X-direction is fixed. The movable mirror 8 is irradiated with a laser beam from a laser interferometer 9. The laser beam reflected by the movable mirror 8 returns to the laser interferometer 9, thereby measuring the position, in the X-direction, of the X-Y stage 5. Although not shown, a similar movable mirror and laser interferometer are also arranged in the Y-direction. A driving device 10 drives the X-Y stage 6 on the basis of the position measured by the laser interferometers, and the like.

A reticle alignment microscope 11 (first alignment means) is arranged in the vicinity of the reticle R. Upon alignment of the reticle R, alignment light from the microscope 11 is irradiated onto an alignment mark RM formed on the reticle R via a mirror 12. Light reflected by the alignment mark RM is reflected by the mirror 12 and returns to the microscope 11. Then, based on the position of the image of the alignment mark RM, which is re-imaged in the microscope 11, the position of the reticle R is adjusted, thus attaining the alignment of the reticle R.

The reticle alignment microscope 11 may be used to simultaneously observe the alignment mark RM on the reticle R and an alignment mark in the reference mark plate 7, and the reticle R may be aligned based on the positional relationship between the images of the two marks. Furthermore, the reticle alignment microscope 11 may be used to simultaneously observe the alignment mark on the reticle R and an alignment mark on the glass plate 4 to obtain the positional relationship therebetween.

A light-transmitting system 13 and a light-receiving system 14 of an auto-focus detection system are arranged between the projection lens (optical system) PL and the glass plate 4. The light-transmitting system 13 projects an image of a detection pattern such as a slit pattern onto the glass plate 4 from an oblique direction with respect to an optical axis AX of the projection optical system PL. Light reflected by the glass plate 4 is incident on the light-receiving system 14, and the image of the detection pattern is re-imaged in the light-receiving system. Based on the amount of displacement of the re-imaged image of the detection pattern, the height of the exposure surface of the glass plate 4 is detected. The Z stage 5 moves based on this detection result, thereby setting the height of the exposure surface of the glass plate 4 at the best focus position with respect to the projection optical system PL.

An optical system for image processing alignment is arranged aside the projection optical system PL. In this optical system, a plate alignment microscope 15 (second alignment means) having an observation area at a position different from the shot area defined by the projection optical system PL is arranged. Light reflected by the observation area of the microscope 15, which is illuminated with an illumination system (not shown), is incident on an indicator plate 17 via the microscope 15 and a mirror 16. The indicator plate 17 is formed by drawing, e.g., a chromium indication mark on a transparent plate. The glass plate 4 (or the reference mark plate 7) and the indicator plate 17 are arranged to be conjugate with respect to the microscope 15, and the image of the mark on the glass plate 4 (or the reference mark plate 7) and the image of the indication mark on the indicator plate 17 are imaged on the indicator plate 17.

Light transmitted through the indicator plate 17 is incident on the image pickup surface of a CCD camera 19 using a charge-coupled image pickup element (CCD) via a relay lens 18. On the image pickup surface, the mark image of the glass plate 4 (or the reference mark plate 7) and the mark image of the indicator plate 17 are formed. A video signal (image pickup signal) outputted from the CCD camera 19 is supplied to a pattern matching device 20. The pattern matching device 20 is connected to a computer (not shown) for managing and controlling the entire projection exposure apparatus.

A method of forming a template according to the present invention will be explained below.

In this embodiment, a template used in pattern matching is synthesized in a software manner.

Figure 2A:
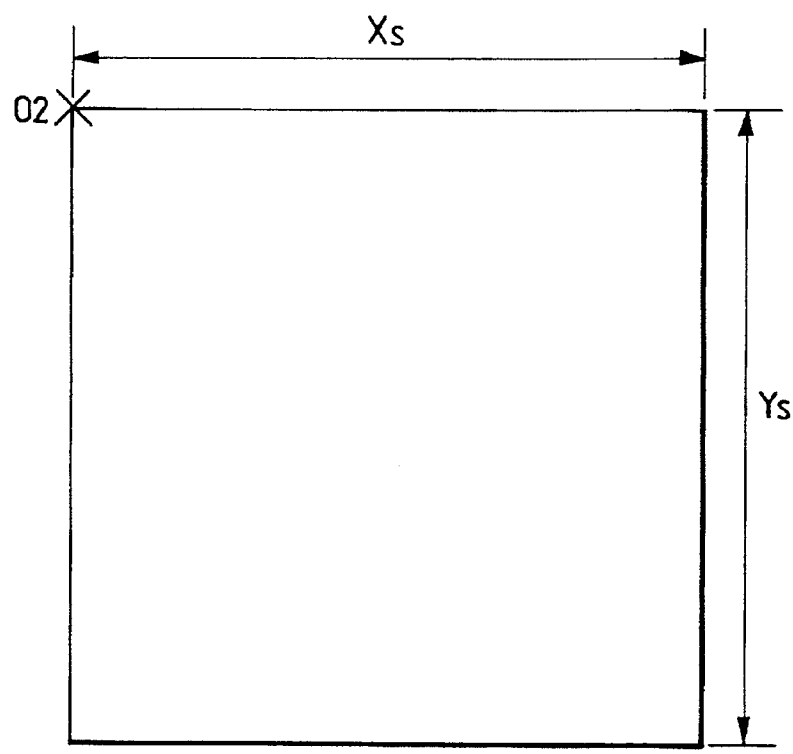
FIGS. 2A and 2B are views for explaining a method of forming a template as the position detection method according to the present invention.

As shown in FIG. 2A, the size $(X_s, Y_s)$ of a template is designated. Furthermore, the brightness of the background of a mark included in the template is designated in a multi-gradation mode.

Figure 2B:
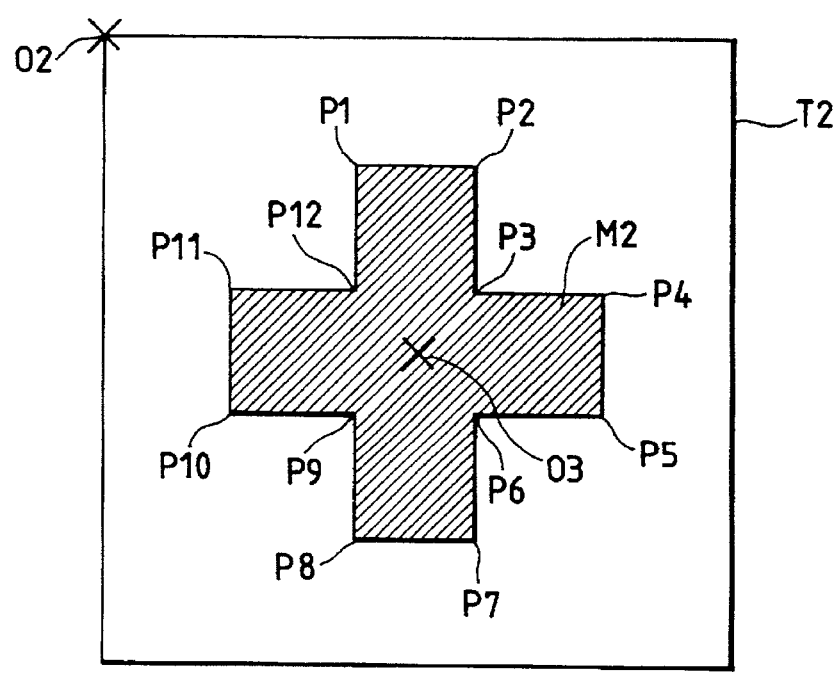

As shown in FIG. 2B, the upper left corner of the template is defined as a temporary origin 02, and parameters for forming a mark M2 (a cross mark similar to a reference mark FM in the reference mark plate 7) at a predetermined position with respect to the temporary origin O2 are designated. The parameters include position data of vertices P1 to P12 of the cross mark with respect to the temporary origin O2.

Then, the brightness in the mark M2 is designated in a multi-gradation mode. Furthermore, an approximate function for generating, in the mark M2, an optical blur formed when an image is actually inputted to the pattern matching device 20 via the plate alignment microscope 15 is designated, thereby generating an arbitrary optical blur (not shown) in the mark M2.

In the template formed as described above, since the position of the mark M2 in the frame of a template image T2 is known, the center of the mark M2 can be accurately set.

Thus, a template in which the center of the mark M2 is set at an origin O3 is registered (i.e. memorized) in the pattern matching device 20.

Note that a mark to be formed in the template may be an arbitrary figure. For example, when a circle is formed as the mark, the position data of the center and radius of the circle can be designated as the parameters.

The position detection method of the present invention in the projection exposure apparatus with the above arrangement, especially, baseline measurement based on pattern matching, will be described below with reference to FIG. 1, FIGS. 3A to 3D, and FIG. 6.

First, templates TM1, TM2, and TM3 used in pattern matching are formed (step 1).

Figure 3A:
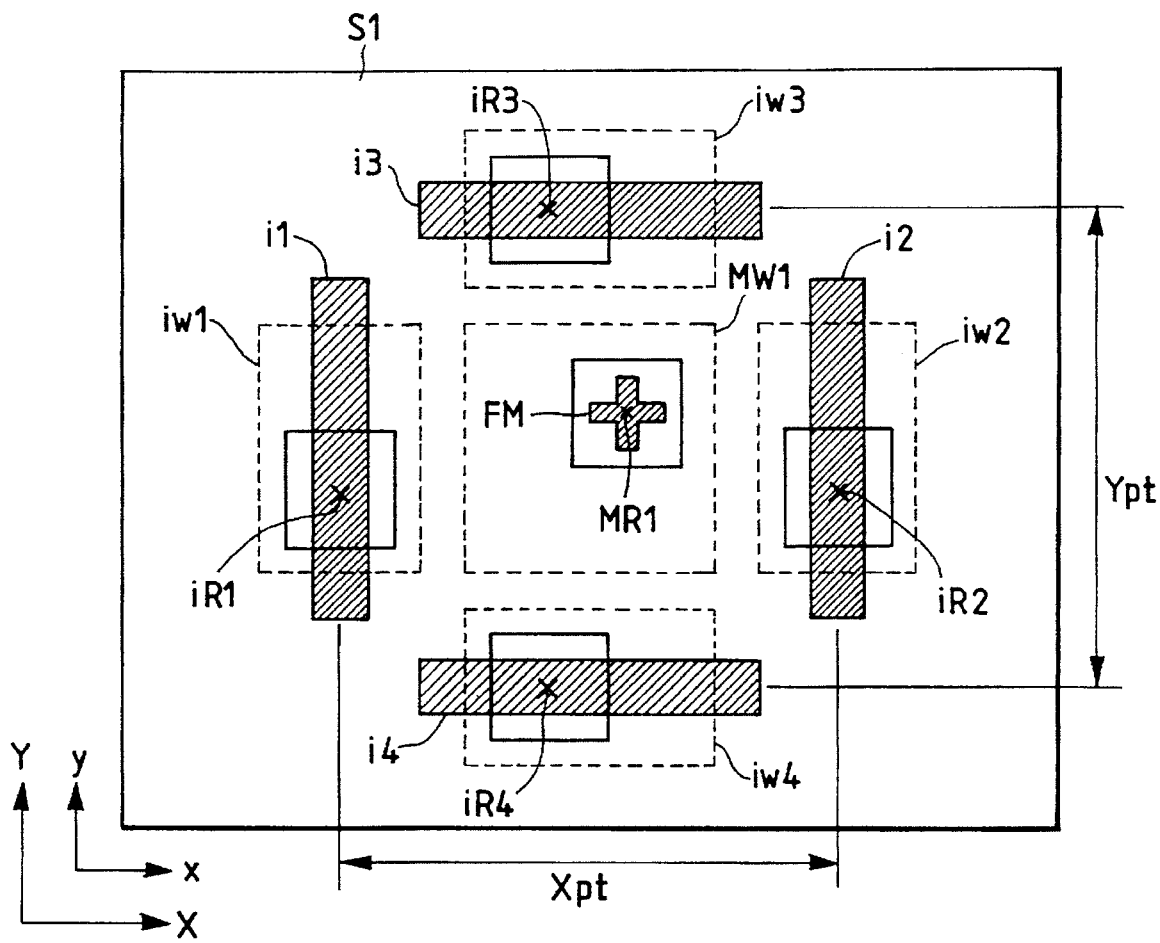
FIGS. 3A to 3D are views for explaining a baseline measurement using the template.
Figure 3B:
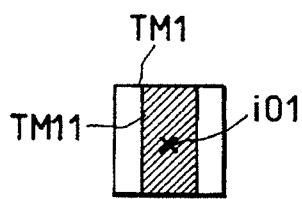

FIG. 3B shows the template TM1 on which a stripe mark TM11 is formed in the Y-direction, and a center iO1 of the template image TM1 coincides with the center, in the X-direction, of the stripe mark TM11.

Figure 3C:
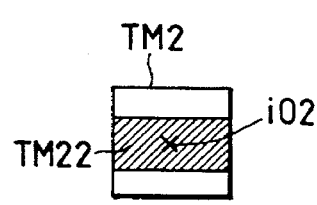

FIG. 3C shows the template TM2 on which a stripe mark TM22 is formed in the X direction, and a center iO2 of the template image TM2 coincides with the center, in the Y-direction, of the stripe mark TM22.

Figure 3D:
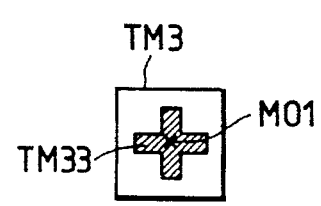
Figure 4:
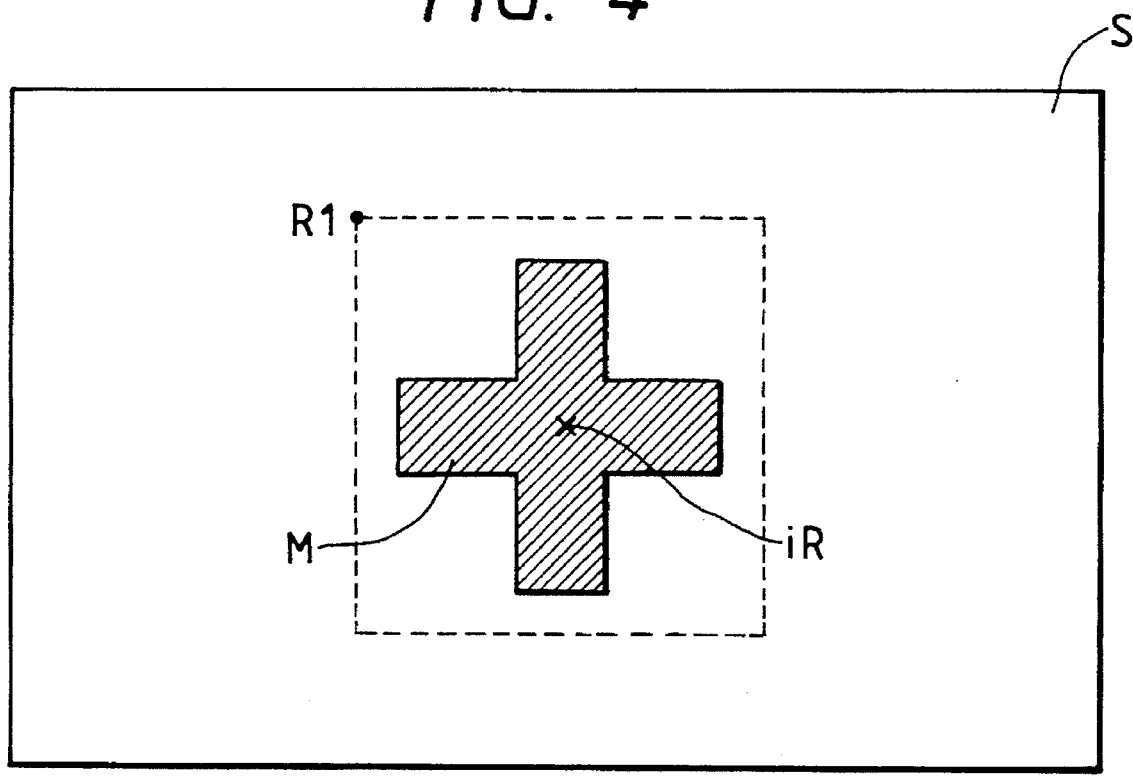
FIG. 4 is a view for explaining a position detection method based on pattern matching.
Figure 5:
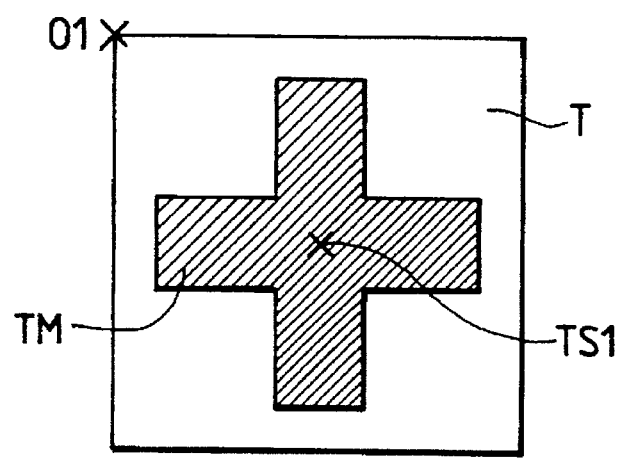
FIG. 5 is a view for explaining the position detection method based on pattern matching.
Figure 6:
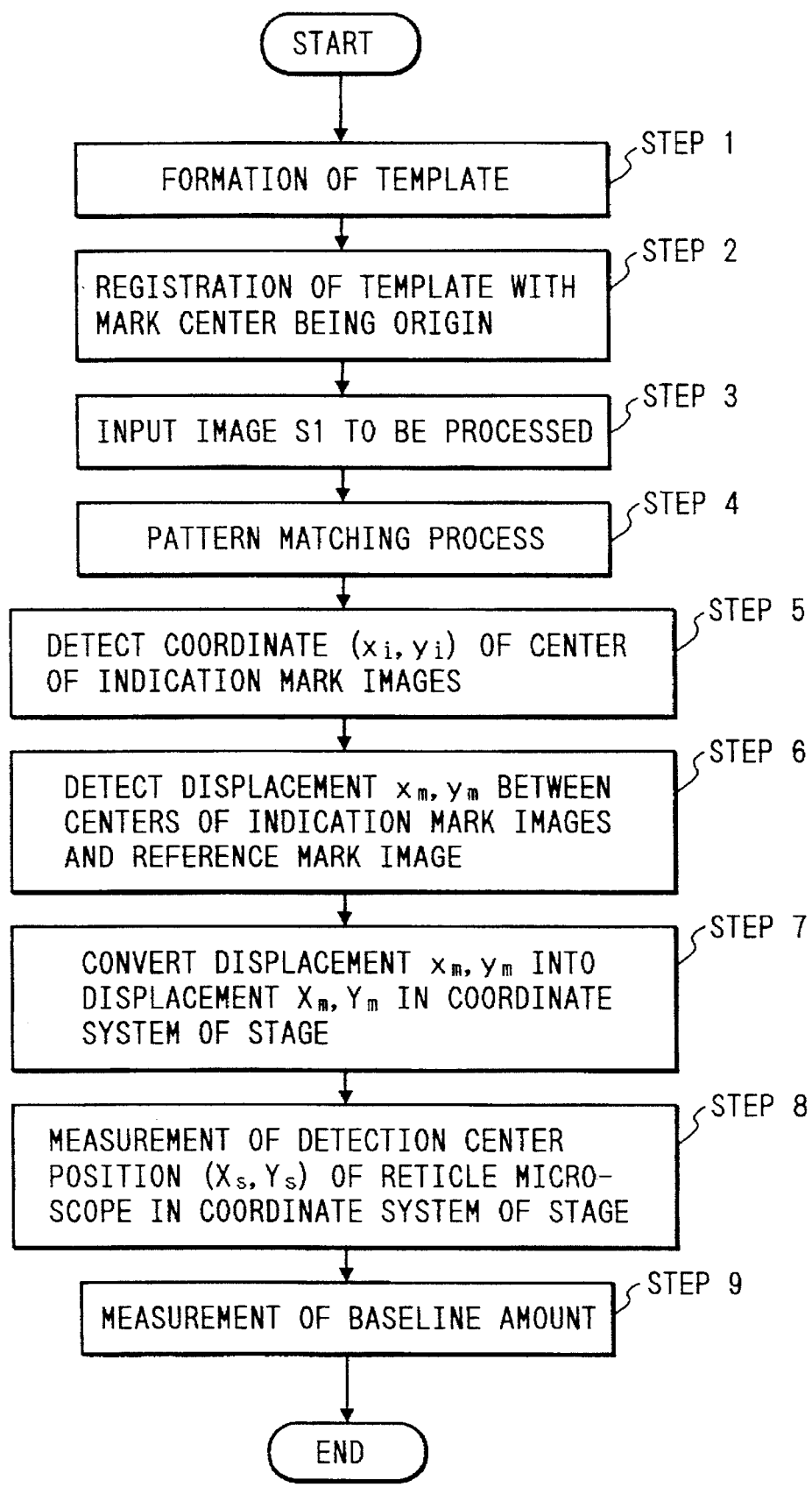
FIG. 6 is a flow chart of the baseline measurement in the embodiment of the present invention.

FIG. 3D shows the template image TM3 on which a cross mark TM33 extending in the X- and Y-directions is formed, and a center MO1 of the template image TM3 coincides with the center of the cross mark TM33.

The template images TM1, TM2, and TM3 are memorized in the pattern matching device 20 to respectively have the centers iO1, iO2, and MO1 as origins (step 2).

By moving the X-Y stage 6, the reference mark plate 7 on the X-Y stage 6 is set within the observation area of the plate alignment microscope 15, and an image S1 to be processed is inputted (step 3).

FIG. 3A shows the image S1 picked up by the CCD camera 19 when the reference mark plate 7 has moved into the observation area of the plate alignment microscope 15.

The image S1 includes images i1 to i4 of indication marks on the indicator plate 17, and an image FM of the reference mark on the reference mark plate 7.

Ranges iW1 to iW4 and MW1 designated by dotted lines in the image S1 correspond to those to be subjected to pattern matching.

The pattern matching processing is performed in the designated ranges iW1 to iW4 and MW1 (step 4). More specifically, pattern matching is performed using the template TM1 in the designated ranges iW1 and iW2, pattern matching is performed using the template TM2 in the designated ranges iW3 and iW4, and pattern matching is performed using the template TM3 in the designated range MW1.

As results of the pattern matching operations in the designated ranges iW1 to iW4 and MW1 in the image S1, detected points iR1 to iR4 and MR1 are obtained as coordinate values of an x-y coordinate system set in the pattern matching device. More specifically, the coordinate values (iR1(x), iR1(y)) of the detected point iR1, and the coordinate values (iR2(x), iR2(y)) of the detected point iR2 are obtained for the origin iO1 of the template image TM1, the coordinate values (iR3(x), iR3(y)) of the detected point iR3, and the coordinate values (iR4(x), iR4(y)) of the detected point iR4 are obtained for the origin iO2 of the template image TM2, and the coordinate values (MR1(x), MR1(y)) of the detected point MR1 are obtained for the origin MO1 of the template image TM3.

The coordinate values ($x_i$, $Y_i$) of the center of the indicator marks are detected based on the pattern matching processing results (step 5).

The x-coordinate value of the detected point iR1 is the center of the stripe mark of the indication mark image i1, the x-coordinate value of the detected point iR2 is the center of the stripe mark of the indication mark i2, the y-coordinate value of the detected point iR3 is the center of the stripe mark of the indication mark image i3, and the y-coordinate value of the detected point iR4 is the center of the stripe mark of the indication mark image i4. For this reason, the coordinate values ($x_i$, $y_i$) of the center of the indicator mark images are given by:

$$x_i = (iR1(x)+iR2(x))/2$$
$$y_i = (iR3(y)+iR4(y))/2 \qquad (1)$$

Then, amounts $x_m$ and $y_m$ of displacement or deviation between the centers of the indication mark images and the reference mark image FM are calculated (step 6). The amounts $x_m$ and $y_m$ of displacement between the centers of the indication mark images and the reference mark image FM are given by:

$$x_m = MR1(x) - x_i$$
$$y_m = MR1(y) - y_i \qquad (2)$$

Coefficients ($C_x$, $C_y$) for converting the coordinate system (x, y) in the pattern matching device 20 into a stage coordinate system (X, Y) as a reference coordinate system in the projection exposure apparatus are expressed by:

$$C_x = X_{pt}/|iR1(x)-iR2(x)| \; [\mu m/\text{pixel}]$$
$$C_y = Y_{pt}/|iR3(y)-iR4(y)| \; [\mu m/\text{pixel}] \qquad (3)$$

where $X_{pt}$ and $Y_{pt}$ are known indicator mark intervals [μm].

The calculation results $x_m$ and $y_m$ in step 6 are converted into amounts $X_m$ and $Y_m$ of displacement in the stage coordinate system (step 7). The calculation results $x_m$ and $y_m$ in step 6 are converted into the amounts $X_m$ and $Y_m$ of displacement in the stage coordinate system by the following formulas:

$$X_m = x_m \cdot C_x \; [\mu m]$$
$$Y_m = y_m \cdot C_y \; [\mu m] \qquad (4)$$

Thus, the displacement between the reference mark FM on the reference mark plate 7 and the centers of the indication mark images i1 to i4 can be expressed with reference to the stage coordinate system (X, Y).

Furthermore, the detection center position ($X_s$, $Y_s$) of the reticle alignment microscope 11 in the stage coordinate system (X, Y) is measured (step 8). This measurement is attained in such a manner that the reticle alignment microscope 11 detects the reference mark on the stage via the reticle R and the projection optical system PL to measure the position of the stage at that time.

Furthermore, a baseline amount is calculated on the basis of the amounts $X_m$ and $Y_m$ of displacement calculated in step 7 and the detection position ($X_s$, $Y_s$) of the reticle alignment microscope measured in step 8 (step 9).

Note that the detection center of the alignment device composed of the microscope 15, the CCD camera 19, the pattern matching device 20, and the like coincides with the centers of the indication mark images. As can be seen from formulas (2), the position of the reference mark FM is expressed with reference to the center of the indication mark images since a positional drift of the detection optical system is taken into account. More specifically, the indication marks are formed to eliminate the influence of this drift. Also, the indication marks are used for calculating the above-mentioned coefficients ($C_x$, $C_y$).

In this manner, the reticle alignment system and the plate alignment system can be managed under the stage coordinate system.

In order to correct any rotation component between the stage coordinate system (X, Y) and the coordinate system (x, y) in the pattern matching device 20, a correction value can be calculated in the following procedure.

More specifically, the reference mark FM (X-Y stage 6) is moved to the left by a predetermined amount in the X-direction so as not to overlap the indication marks i1 to i4. At this position, pattern matching is performed using the template image TM3. The pattern matching result at that time is represented by $(x_l, y_l)$. Similarly, the reference mark FM is moved to the right by the predetermined amount in the X-direction, and pattern matching is performed. The pattern matching result at that time is represented by $(x_r, y_r)$. As a result, a rotation amount R to be corrected is given by:

$$R = \tan^{-1} \frac{y_l - y_r}{x_l - x_r} \qquad (5)$$

According to the above-mentioned method, since a template in the position detection method based on the pattern matching method has a pattern synthesized in a software manner, the positional relationship between a mark included in the template and the reference position in the exposure apparatus can be determined, and the baseline measurement, i.e., the position detection of the alignment device with reference to the absolute coordinate system in the projection optical system, can be realized.

In the above-mentioned embodiment, the baseline measurement of the plate alignment system has been exemplified. When the same arrangement is provided to the reticle alignment system, the baseline measurement of the reticle alignment system can be similarly performed.

What is claimed is:

1. A position detection method in an exposure apparatus for transferring a pattern on a mask onto a photosensitive substrate via a projection optical system, comprising the steps of:

creating a representation of an image having a first mark at a predetermined position therein, and memorizing the representation as a reference image;

moving a stage for carrying the photosensitive substrate, which moves along a reference coordinate system and is formed with a reference mark on a surface thereof, to a predetermined position in the reference coordinate system;

receiving an image of an area of the surface of the stage including the reference mark to obtain an image to be processed, an image of the reference mark having substantially the same shape as the first mark;

performing pattern matching of the image to be processed and the reference image to detect a position of the reference mark image in the image to be processed; and detecting a relationship between the image to be processed and the reference coordinate system based on the detected position of the reference mark image in the image to be processed.

2. A position detection method comprising the steps of:

creating a representation of an image having a first mark at a predetermined position therein, and memorizing the representation as a reference image;

receiving an image of an area including a reference mark formed at a predetermined position in a predetermined reference coordinate system to obtain an image to be processed, an image of the reference mark having substantially the same shape as the first mark;

performing pattern matching of the image to be processed and the reference image to detect a position of the reference mark image in the image to be processed; and detecting a relationship between the image to be processed and the reference coordinate system based on the detected position of the reference mark image in the image to be processed.

3. A position detection method comprising the steps of:

creating a representation of an image having a first mark at a predetermined position therein, and memorizing the representation as a reference image;

receiving an image to be processed formed with a second mark corresponding to the first mark; and performing pattern matching of the image to be processed and the reference image to detect a position of the second mark in the image to be processed.

4. A detection method for detecting a positional relationship between a predetermined reference and a substrate alignment device in an exposure apparatus, comprising:

providing, as the predetermined reference, a reference mark at a predetermined position of the exposure apparatus;

memorizing, as a reference image, a representation of an image having at a predetermined position therein a feature corresponding to said reference mark;

obtaining an image to be processed by receiving an image of an area containing said reference mark with said substrate alignment device;

detecting a position of an image portion corresponding to said reference image in said image to be processed; and detecting a positional relationship between said substrate alignment device and said reference mark based on said detected position.

5. A method according to claim 4, wherein the exposure apparatus includes a second alignment device for detecting a position of a second substrate and having an alignment reference at a second predetermined position of the exposure apparatus, said method further comprising detecting a positional relationship between the substrate alignment device and the alignment reference of the second alignment device based on said positional relationship between said substrate alignment device and said reference mark.

6. A method according to claim 4, further comprising creating the reference image by designating an image area, designating points of said feature relative to a temporary origin of said image area, designating brightnesses of said feature and a background in said image area, and designating a function of optical blur of said feature, and wherein the reference image is memorized with a predetermined position of said feature as an origin.

* * * * *